United States Patent [19]

Okada et al.

[11] 4,288,754
[45] Sep. 8, 1981

[54] FILTER CIRCUIT

[75] Inventors: Takashi Okada, Yokohama; Yasunobu Kuniyoshi, Tokyo, both of Japan

[73] Assignee: Sony Corporation, Tokyo, Japan

[21] Appl. No.: 78,205

[22] Filed: Sep. 24, 1979

[30] Foreign Application Priority Data

Sep. 26, 1978 [JP] Japan .................. 53-118248

[51] Int. Cl.³ .............................................. H03F 3/45
[52] U.S. Cl. .................................. 330/260; 330/294; 330/305; 330/306
[58] Field of Search ............... 330/260, 303, 305, 306, 330/307, 294

[56] References Cited

U.S. PATENT DOCUMENTS 3,614,478 10/1971 Schiff .............................. 330/260 X
3,969,682 7/1976 Rossum ........................... 330/260 X

OTHER PUBLICATIONS

Franco, "Use Transconductance Amplifiers to Make Programmable Active Filters," *Electronic Design*, vol. 24, No. 19, pp. 98-101, Sep. 13, 1976.

*Primary Examiner*—James B. Mullins
*Attorney, Agent, or Firm*—Lewis H. Eslinger; Alvin Sinderbrand

[57] ABSTRACT

A filter circuit, preferably a low-pass filter, whose cut-off frequency is easily controlled and which can be manufactured as an integrated circuit. First and second transistors are connected in differential amplifier configuration, and a current source is connected to the common connection of the emitter electrodes thereof. The base electrode of the first transistor is connected to an input terminal. A reactance element is connected between the collector electrode of the second transistor and a source of reference potential, such as ground. A third transistor has its emitter electrode connected to the base electrode of the second transistor and its base electrode connected to the collector electrode of the second transistor. An output terminal is connected to the emitter electrode of the third transistor.

8 Claims, 9 Drawing Figures

FILTER CIRCUIT

BACKGROUND OF THE INVENTION

This invention relates to a filter circuit and, more particularly, to a filter circuit whose cut-off frequency is easily controlled and, moreover, which can be constructed as an integrated circuit.

It is conventional to fabricate filter circuits as integrated circuits. For cost effectiveness in manufacturing such integrated circuit filters, it is important that the number of external connections which are needed for proper operation thereof, that is, the number of connecting terminals which must be provided, be minimized. Heretofore, active filters have been manufactured as integrated circuits. However, in typical IC active filters, the resistance values of the various resistive elements often cannot be as high as desired. This results in a non-uniform cut-off frequency. That is, in a particular run or batch of IC active filters, the cut-off frequency of one may differ from that of the other.

Another difficulty found in IC active filters is that, since the temperature characteristic of the resistive elements often is less than satisfactory, the cut-off frequency of the filter is, to a significant extent, dependent upon temperature. Thus, the operating characteristics of the IC active filter may become unstable with temperature deviations.

Yet another disadvantage in typical IC active filters is that a low cut-off frequency for either a low-pass filter or a high-pass filter is not easily obtainable because the resistance and capacitance values of the resistive and capacitive elements therein are not as high as desired. That is, limitations on the resistive and capacitive values prevent the filter from having a relatively low cut-off frequency.

OBJECTS OF THE INVENTION

Therefore, it is an object of the present invention to provide an improved filter circuit which overcomes the aforenoted difficulties and problems attending prior art IC active filters.

Another object of this invention is to provide a filter circuit whose cut-off frequency can be controlled easily, and which can be manufactured as an integrated circuit.

A further object of this invention is to provide a variable filter circuit whose cut-off frequency is controlled as a function of a control signal.

An additional object of this invention is to provide a filter circuit which exhibits a controllable cut-off frequency such that manufactured filters of different batches all can be controlled to exhibit substantially identical operating characteristics.

Yet another object of this invention is to provide an improved filter circuit whose operation is relatively unaffected by temperature.

A still further object of this invention is to provide a low-pass filter circuit whose cut-off frequency may be made desirably low.

Various other objects, advantages and features of the present invention will become readily apparent from the ensuing detailed description, and the novel features will be particularly pointed out in the appended claims.

SUMMARY OF THE INVENTION

In accordance with this invention, the filter circuit is provided with first and second transistors connected in differential amplifier configuration having their emitter electrodes coupled in common to a current source. An input terminal is connected to the base electrode of the first transistor. A reactance element, such as a capacitor, is connected between the collector electrode of the second transistor and a source of reference potential, such as ground. A third transistor has its emitter and base electrodes connected to the base and collector electrodes respectively, of the second transistor. An output terminal is connected to the emitter electrode of the third transistor. Various embodiments of the filter circuit are disclosed.

BRIEF DESCRIPTION OF THE DRAWINGS

The following detailed description, given by way of example, will best be understood in conjunction with the accompanying drawings in which.

DETAILED DESCRIPTION OF PREFERRED EMBODIMENTS

Figure 1:
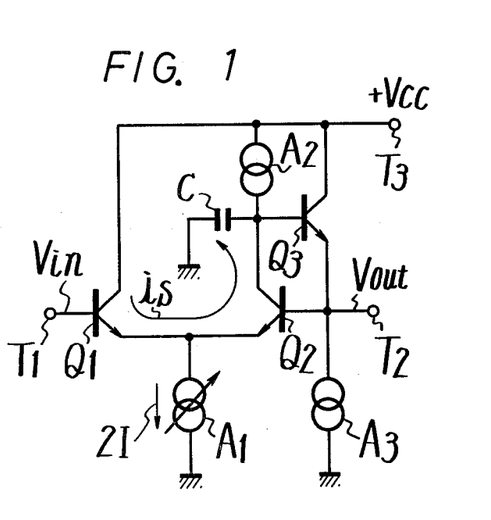
FIGS. 1-9 are schematic representations of various embodiments of the filter circuit in accordance with the present invention.

Referring now to the drawings, wherein like reference numerals are used throughout, and in particular to FIG. 1, there is illustrated a basic embodiment of a filter circuit in accordance with the teachings of the present invention. The circuit shown herein is comprised of transistors $Q_1$, $Q_2$ and $Q_3$.

Transistors $Q_1$ and $Q_2$ are connected in differential amplifier configuration with their emitter electrodes connected in common. The common connection of these emitter electrodes is coupled to ground by a controllable current source $A_1$. The base electrode of transistor $Q_1$ is connected to an input terminal $T_1$ and the collector electrode thereof is connected to a terminal $T_3$ supplied with an operating potential $+V_{cc}$.

A reactance element, shown herein as a capacitor C, is connected between the collector electrode of transistor $Q_2$ and a source of reference potential, such as ground, to serve as an AC load. It will be appreciated that, if desired, other reactive elements, such as an inductance, may be used in place of capacitor C. A current source $A_2$ also is connected to the collector for electrode of transistor $Q_2$.

Transistor $Q_2$ has its base and emitter electrodes connected to the collector and base electrodes, respectively, of transistor $Q_2$. The collector electrode of transistor $Q_3$ is connected to terminal $T_3$. Another current source $A_3$ connects the emitter electrode of transistor $Q_3$ to ground; and this emitter electrode also is connected to an output terminal $T_2$.

In operation, let it be assumed that the input voltage applied to terminal $T_1$ is represented as $V_{in}$, and let it be further assumed that the output voltage provided at terminal $T_2$ that is, at the emitter electrode of transistor $Q_3$, is represented as $V_{out}$. With current source $A_3$ connected to the emitter electrode of transistor $Q_3$, it is appreciated that this transistor exhibits an emitter-follower configuration. Hence, if the base-emitter voltage drop across this transistor is neglected, the voltage at the base electrode thereof is substantially equal to the voltage at the emitter electrode thereof. Thus, the voltage provided at the base electrode of transistor $Q_3$ is substantially equal to $V_{out}$.

Let it be assumed that the angular frequency of the voltage provided at the terminal $T_1$ is represented as $\omega$.

As a result of this signal, a signal current $i_s$ flows through the common-connected emitter electrodes of transistors $Q_1$ and $Q_2$. The resistance in this path traversed by the signal current is equal to the emitter resistances of these transistors. If each emitter resistance is represented as $r_e$, and if these resistances are equal, then the signal current $i_s$ is equal to the voltage difference between the base voltages of transistors $Q_1$ and $Q_2$ divided by the emitter resistance in this circuit, or $$i_s = \frac{V_{in} - V_{out}}{r_e + r_e} . \quad (1)$$

This signal current $i_s$ also flows through capacitor C to produce the output volage $V_{out}$. As mentioned above, the base voltage of transistor $Q_3$ is substantially equal to $V_{out}$. Accordingly, the voltage across capacitor C may be expressed as:

$$V_{out} = i_s / j\omega C \quad (2)$$

The transfer function $H(\omega)$ of the filter shown in FIG. 1 is equal to the output voltage divided by the input voltage. From equations (1) and (2), this transfer function may be expressed as:

$$H(\omega) = V_{out} - V_{in} \quad (3)$$

$$H(\omega) = \frac{1}{1 + j\omega 2 C r_e}$$

The transfer function expressed in equation (3) indicates that the filter circuit of FIG. 1 functions as a low-pass filter whose cut-off frequency $\omega_c$ may be represented as:

$$\omega_c = \tfrac{1}{2} C r_e \quad (4)$$

Now, if the current which flows through current source $A_1$ is represented as $2I$, then, since the emitter currents of transistor $Q_1$ and $Q_2$ are equal, the emitter current of each transistor is equal to I. The emitter resistance $r_e$ is related to the emitter current I in each of transistors $Q_1$ and $Q_2$ in accordance with the following expression:

$$r_e = \frac{kT}{qI}, \quad (5)$$

wherein k is the Boltzmann constant, T is absolute temperature and q is the charge of an electron.

If equation (5) is substituted into equations (3) and (4), then the transfer function $H(\omega)$ and the filter cut-off frequency $\omega_c$ may be rewritten as:

$$H(\omega) = \frac{1}{1 + j\omega \cdot \frac{2kT}{q} \cdot \frac{C}{I}} \quad (6)$$

$$\omega_c = \frac{q}{2kT} \cdot \frac{I}{C} . \quad (7)$$

It is, therefore, appreciated that the cut-off frequency of the low-pass filter shown in FIG. 1 can be changed, or controlled, as a function of the magnitude of the current flowing through current source $A_1$. Various embodiments of current source circuits are known to those of ordinary skill in the art, and an example thereof is described in greater detail below. Since the current through a current source may be controlled by a suitable control signal, it is further recognized that the operating characteristics, that is, the transfer function and cut-off frequency of the filter circuit illustrated in FIG. 1 may be controlled in response to such a control signal. Consequently, since the cut-off frequency is established as a function of the current I, as is apparent from equation (7), and since this current can be controlled easily, the cut-off frequency $\omega_c$ from one filter circuit to another may be suitably controlled so as to be uniform. Furthermore, even though equation (7) represents that the cut-off frequency is dependent upon temperature T, it is appeciated that this temperature dependency can be cancelled by suitably controlling current I. For example, if the temperature increases, the current may be increased, in response to the aforementioned control signal, so as to balance, or cancel, any effect upon the cut-off frequency attributed to this change in temperature.

Another advantage of the circuit shown in FIG. 1 is that, even though the capacitance of capacitor C may be limited by reason of state-of-the-art integrated circuit fabrication techniques, the cut-off frequency $\omega_c$ may be made as low as desired merely by reducing the current I. Thus, it is seen that the embodiment shown in FIG. 1 overcomes the aforenoted disadvantages of prior art IC active filters and that the present invention is capable of providing low-pass filters of uniform cut-off frequency, of good temperature immunity and of low cut-off frequencies, as desired. Also, since the cut-off frequency is determined by the current of current source $A_1$, the cut-off frequency can be varied rapidly over a relatively wide range merely by controlling the current source. That is, as the current I changes, the cut-off frequency changes in the corresponding manner.

Yet another advantage of the embodiment shown in FIG. 1 is that the output impedance thereof is determined by the output impedance of transistor $Q_3$. It is appreciated that this output impedance is relatively low. Also, the DC potential at input terminal $T_1$ is equal to that at output terminal $T_2$. Consequently, the illustrated filter circuit can be connected to other circuits without undesired loading effects, and may be incorporated easily in a multi-stage device.

The signal current $i_s$ is, of course, a function of the input voltage $V_{in}$. As this signal current varies, the emitter resistance $r_e$ of each of transistors $Q_1$ and $Q_2$ also may vary. However, by reason of the differential amplifier configuration of these transistors, it should be recognized that such variations in the emitter resistances thereof are in opposite directions. That is, if the emitter resistance of one transistor increases by reason of signal current $i_s$, the emitter resistance of the other transistor decreases. Consequently, such a change in the emitter resistances because of a change in the signal current has a cancelling effect. As a result thereof, the apparent change in emitter resistance $r_e$ caused by signal current $i_s$ is negligible. This means that the illustrative filter circuit exhibits a good distortion factor and a wide dynamic range.

Figure 2:
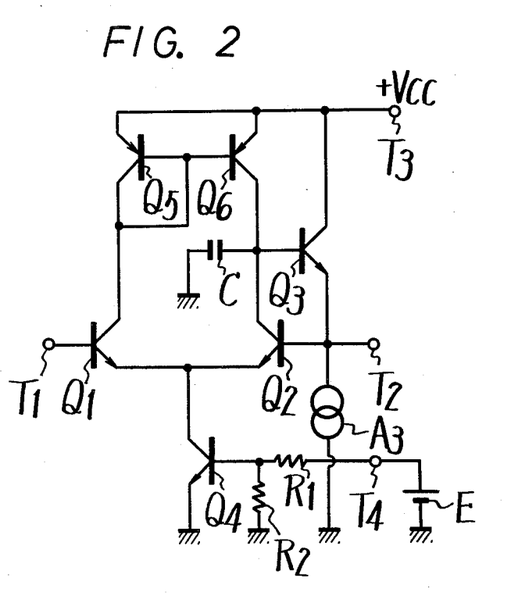

Another embodiment of the present invention is illustrated in FIG. 2. This embodiment differs from that shown in FIG. 1 in that current source $A_2$, which is coupled to the collector electrode of transistor $Q_2$, is constituted by a transistor $Q_6$ which is connected to a transistor $Q_5$ in a current mirror circuit configuration. Also, in the embodiment of FIG. 2, a particular example of current source $A_1$ is illustrated as comprising transistor $Q_4$ whose base electrode is supplied with a control voltage E via a voltage divider circuit formed of resistors $R_1$ and $R_2$. Control voltage E is applied to a terminal $T_4$ which, in turn, is connected to the voltage divider circuit.

When a current mirror circuit is used as current source $A_2$, as shown in FIG. 2, signal current $i_s$ through capacitor C is doubled. That is, because of this current mirror circuit, signal current $i_s$ exhibits twice the value in FIG. 2 than in FIG. 1 for the same input voltage $V_{in}$. Consequently, the cut-off frequency $\omega_c$ for the embodiment of FIG. 2 is twice the cut-off frequency for the embodiment of FIG. 1, and may be expressed as:

$$\omega_c = \frac{q}{kT} \cdot \frac{I}{C}. \quad (8)$$

Of course, if control voltage E is varied, the collector current of transistor $Q_4$ is varied in response thereto. Hence, a change in the control voltage results in a change in current I so as to vary or adjust the cut-off frequency $\omega_c$.

From equation (8), it is seen that the cut-off frequency is dependent upon temperature T. For example, if the temperature increases, it would appear that the cut-off frequency $\omega_c$ decreases. However, in the embodiment of FIG. 2, since current source $A_1$ is constituted by transistor $Q_4$, it is recognized that the increase in temperature T results in an increase in the collector current of transistor $Q_4$. This means that, as temperature T changes, current I in equation (8) changes in a similar manner. Consequently, any dependency of the cut-off frequency on temperature is cancelled. That is, a reduction in the cut-off frequency caused by an increase in temperature is cancelled because current I also increases by a corresponding amount. Thus, in practice, the cut-off frequency $\omega_c$ is not temperature dependent to any significant extent and, therefore, the temperature characteristic of the illustrated filter circuit is improved over the prior art.

Figure 3:
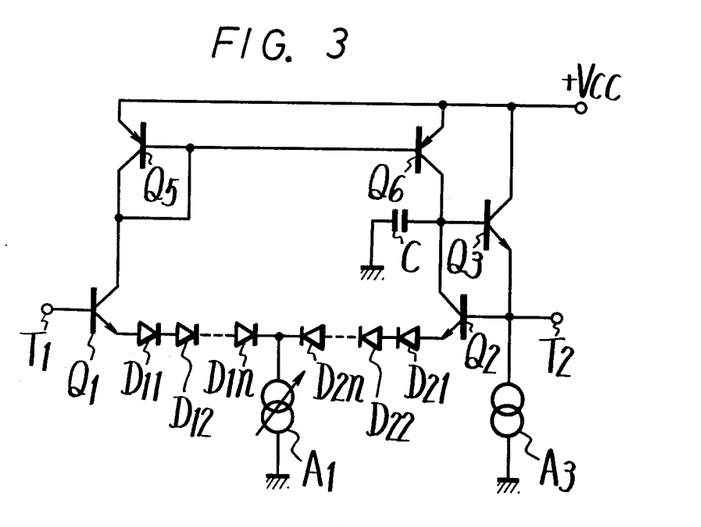

Another embodiment of the present invention is illustrated in FIG. 3. This embodiment differs from that described above with respect to FIG. 2 in that current source $A_1$ is not specified as being of any specific construction, although it may, of course, be constructed as shown in FIG. 2; and in that a series of n diodes is connected in the emitter circuit of transistor $Q_1$ and a series of n diodes is connected in the emitter circuit of transistor $Q_2$. As shown specifically, diodes $D_{11}$, $D_{12}$, ... $D_{1n}$ are connected in series between the emitter electrode of transistor $Q_1$ and current source $A_1$. Similarly, diodes $D_{21}$, $D_{22}$, ... $D_{2n}$ are connected in series between the emitter electrode of transistor $Q_2$ and the current source. Each diode exhibits a resistance $r_e$. That is, the resistance of each diode is equal to the emitter resistance of transistor $Q_1$ (and also transistor $Q_2$). This equal resistance may be attained easily in accordance with conventional integrated circuit manufacturing techniques. Hence, the effective resistance between the base electrode of transistor $Q_1$ and current source $A_1$ is equal to $(n+1) r_e$. Similarly, the effective resistance between current source $A_1$ and the base electrode of transistor $Q_2$ is equal to $(n+1) r_e$. Thus, in the embodiment shown in FIG. 3, the resistance in the path traversed by signal current $i_s$ is equal to $2(n+1) r_e$. With this value of resistance, the derivation of the mathematical expression for cut-off frequency $\omega_c$ results in the following:

$$\omega_c = \frac{q}{kT} \cdot \frac{I}{(n+1)C}. \quad (9)$$

A comparison of equations (8) and (9) indicates that the cut-off frequency $\omega_c$ for the embodiment of the filter circuit shown in FIG. 3 will, for equal currents I and for equal capacitance C, be lower than the cut-off frequency for the embodiment of the filter circuit shown in FIG. 2. That is, the cut-off frequency for the embodiment shown in FIG. 3 is $1/(n+1)$ the cut-off frequency for the embodiment of FIG. 2. It is appreciated that if the cut-off frequency is to be the same for both embodiments, then the current I in equation (9) must be $(n+1)$ times as great as the current I in equation (8). If the magnitude of the current I relative to the magnitude of signal current $i_s$ is large, as in the FIG. 3 embodiment, the dynamic range of the filter circuit is increased. Thus, for equal cut-off frequencies, the dynamic range of the embodiment shown in FIG. 3 is wider than the dynamic range of the embodiment shown in FIG. 2.

Figure 4:
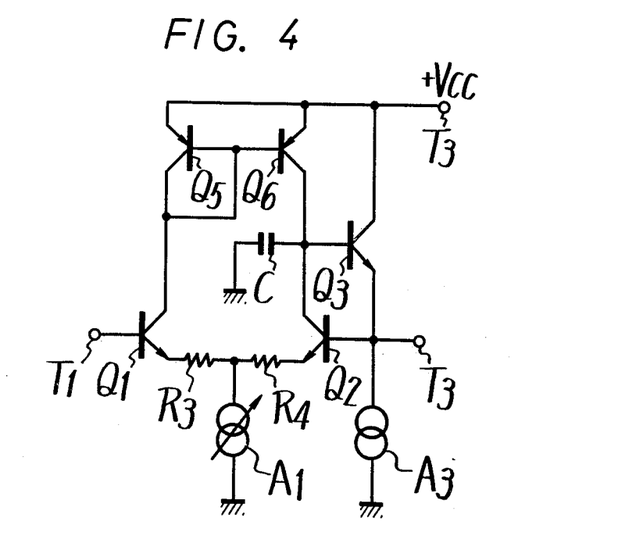

Referring now to the embodiment shown in FIG. 4, it is recognized that this embodiment is substantially similar to that described above with respect to FIG. 3, except that the diode resistances $r_e$ of the FIG. 3 embodiment are replaced by ohmic resistances $R_3$ and $R_4$ in the FIG. 4 embodiment. Hence, the FIG. 4 embodiment attains substantially the same results and exhibits substantially the same effects as the FIG. 3 embodiment. That is, for the same value of current I, and for the same value of capacitance C, the cut-off frequency for the embodiment of FIG. 4 is substantially reduced relative to the cut-off frequency for the embodiment of FIG. 2 dependent upon the values of resistances $R_3$ and $R_4$. Also, if the cut-off frequency $\omega_c$ for the embodiment of FIG. 4 is to be equal to the cut-off frequency for the embodiment of FIG. 2, then the current I in the FIG. 4 embodiment is relatively large as compared to its signal current $i_s$. Hence, the dynamic range of the FIG. 4 embodiment is wider than the dynamic range of the FIG. 2 embodiment.

Figure 5:
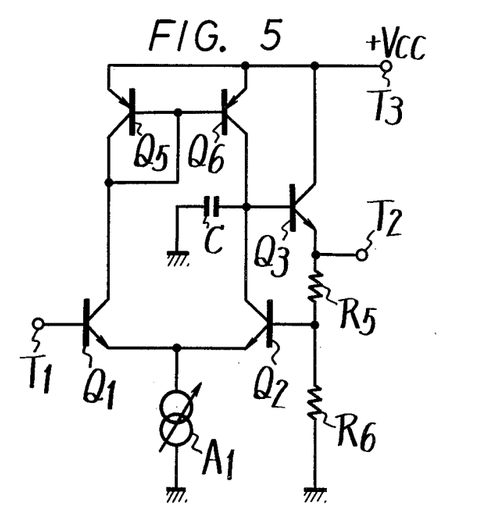

In all of the aforedescribed embodiments, the output voltage $V_{out}$ provided at the emitter electrode of transistor $Q_3$ is fed back substantially in its entirety (that is, approximately 100 percent of the output voltage is fed back) to the base electrode of transistor $Q_2$. In the embodiment of FIG. 5, current source $A_3$ is formed by series-connected resistors $R_5$ and $R_6$ which, as is known, serve as a current source if the resistors exhibit a sufficiently high resistance value. In addition to functioning as a current source, resistors $R_5$ and $R_6$ serve as a voltage divider. Thus, a voltage-divided portion of output voltage $V_{out}$ provided at the emitter electrode of transistor $Q_3$, which transistor is connected in emitter-follower configuration, is applied to the base electrode of transistor $Q_2$. The voltage dividing ratio K is equal to $R_6/(R_5+R_6)$. Accordingly, the voltage which is fed back to the base electrode of transistor $Q_2$ is equal to $KV_{out}$.

Since only a portion of the output voltage is fed back to the base electrode of transistor $Q_2$, the transfer function $H(\omega)$ and the cut-off frequency $\omega_c$ of the illustrated filter circuit both are functions of this ratio K. The transfer function and the cut-off frequency may, therefore, be expressed as follows:

$$H(\omega) = \frac{1}{K} \cdot \frac{1}{1 + j\omega \cdot \frac{kT}{q} \cdot \frac{C}{KI}} \quad (10)$$

$$\omega_c = \frac{q}{kT} \cdot \frac{KI}{C} \quad (11)$$

From equation (11), it is recognized that, in accordance with the embodiment shown in FIG. 5, the cut-off frequency $\omega_c$ is reduced by an amount determined by the voltage-dividing ratio K relative to the embodiment discussed above with respect to FIG. 2. If, in the FIG. 5 embodiment, the cut-off frequency is to be equal to that of the FIG. 2 embodiment, then, from equation (11), it is appreciated that current I must be increased. Hence, the dynamic range of the FIG. 5 embodiment will be wider than that of the FIG. 2 embodiment.

Figure 6:
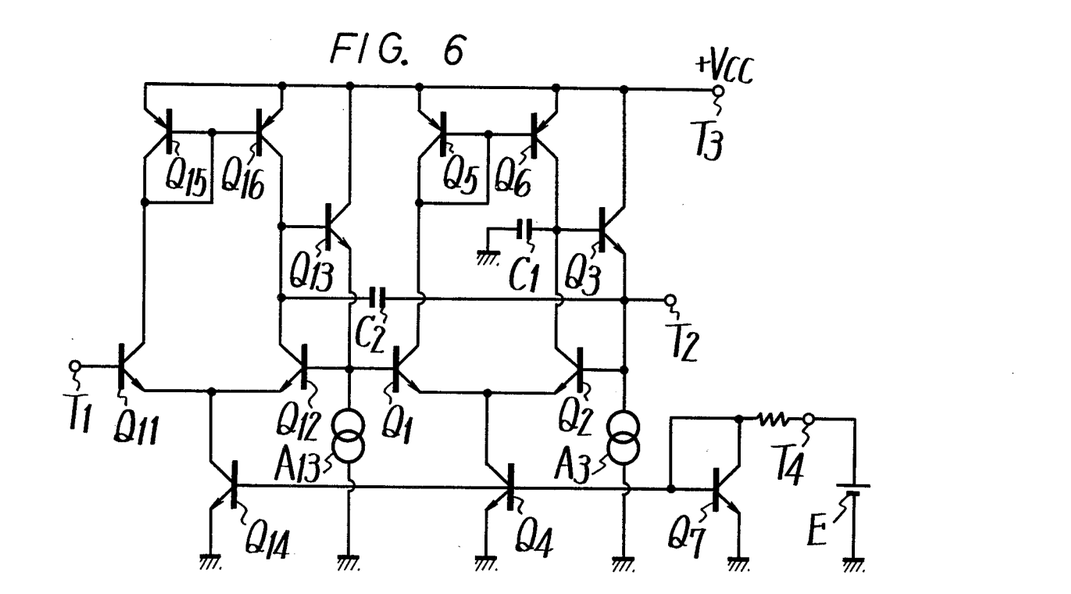

Yet another embodiment of the present invention is illustrated in FIG. 6, wherein two stages of the low-pass filter shown in, for example, FIG. 2 are connected in cascade. One stage is comprised of transistors $Q_1$–$Q_6$, interconnected in the manner described above with respect to FIG. 2. However, the input of this stage, that is, the base electrode of transistor $Q_1$, is connected to the output of a preceding stage which is comprised of transistors $Q_{11}$–$Q_{16}$. Respective ones of the latter transistors correspond to transistors $Q_1$–$Q_6$ and are interconnected in a similar manner. Thus, transistors $Q_{11}$ and $Q_{12}$ are connected in differential amplifier configuration with their common-connected emitter electrodes coupled to ground by current source transistor $Q_{14}$. The base electrode of transistor $Q_{11}$ is connected to input terminal $T_1$ to receive a signal to be filtered. Furthermore, a current mirror circuit formed of transistors $Q_{15}$ and $Q_{16}$ is connected to the collector electrodes of transistors $Q_{11}$ and $Q_{12}$, similar to the current mirror transistors $Q_5$ and $Q_6$ connected to transistors $Q_1$ and $Q_2$.

Capacitor $C_2$ in the preceding filter stage is connected between the collector electrode of transistor $Q_{12}$ and output terminal $T_2$ of the following stage. Thus, the "reference" potential to which capacitor $C_2$ is coupled is the output DC potential. Finally, transistor $Q_{13}$ is connected in a manner similar to transistor $Q_3$, in that the emitter electrode of transistor $Q_{13}$ is coupled to ground by a current source $A_{13}$ and also to the base electrode of transistor $Q_{12}$, and the base electrode of transistor $Q_{13}$ is connected to the collector electrode of transistor $Q_{12}$. The output of the first filter stage is derived from the emitter electrode of transistor $Q_{13}$ and, as mentioned above, is coupled to the input of the second stage, i.e., to the base electrode of transistor $Q_1$.

Transistors $Q_4$ and $Q_{14}$ serve as respective current sources, and also are connected with a transistor $Q_7$ in current mirror configuration. That is, the base electrodes of transistors $Q_4$ and $Q_{14}$ are connected in common with the base electrode of transistor $Q_7$, the emitter electrodes of transistors $Q_4$ and $Q_{14}$ are connected in common with the emitter electrode of transistor $Q_7$, and the collector electrode of the latter transistor is connected to its base electrode and also to terminal $T_4$ to receive a control voltage E applied thereat.

In the embodiment of FIG. 6, let it be assumed that the collector current of transistor $Q_{14}$ is equal to $2I_1$, and the collector current of transistor $Q_4$ is equal to $2I_2$. The cut-off frequency $\omega_c$ of these cascaded filters can be derived analogous to the foregoing derivations such that the cut-off frequency is:

$$\omega_c = \frac{q}{kT} \sqrt{\frac{I_1 \cdot I_2}{C_1 \cdot C_2}} \quad (12)$$

The quality factor Q of this circuit may be expressed as:

$$Q = \sqrt{\frac{C_1 \cdot I_2}{C_2 \cdot I_1}} \quad (13)$$

Figure 7:
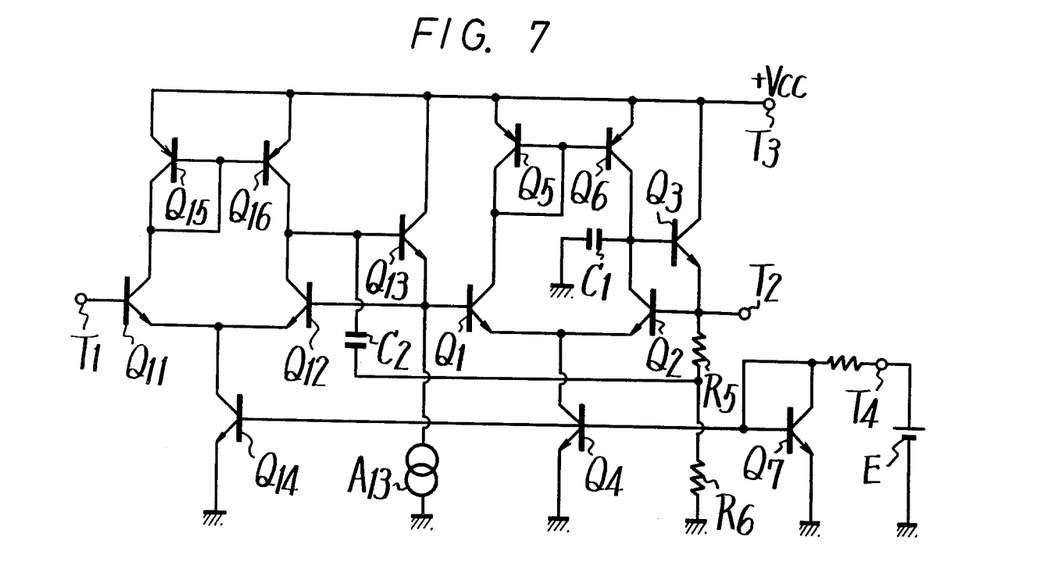

FIG. 7 illustrates another embodiment of the present invention which is similar to that just described with respect to FIG. 6, except that, rather than supplying 100% of the output voltage to the base electrode of transistor $Q_2$, a voltage-divided ratio K of this output voltage is supplied. It is seen that the second filter stage in FIG. 7 is analogous to the embodiment of FIG. 5. Thus, resistors $R_5$ and $R_6$ serve as a voltage-divider circuit having the ratio K (wherein $K = R_6/R_5 + R_6$). Also, capacitor $C_2$ of the first stage is coupled to the junction defined by resistors $R_5$ and $R_6$ to receive K times the output DC potential.

The operation of the filter circuit shown in FIG. 7 is similar to that of FIG. 6, except that the cut-off frequency $\omega_c$ of the FIG. 7 embodiment is reduced by an amount that is a function of K. In the interest of brevity, and since one of ordinary skill in the art would recognize the transfer function and cut-off frequency relationships for this embodiment, further description of FIG. 7 is not provided.

Figure 8:
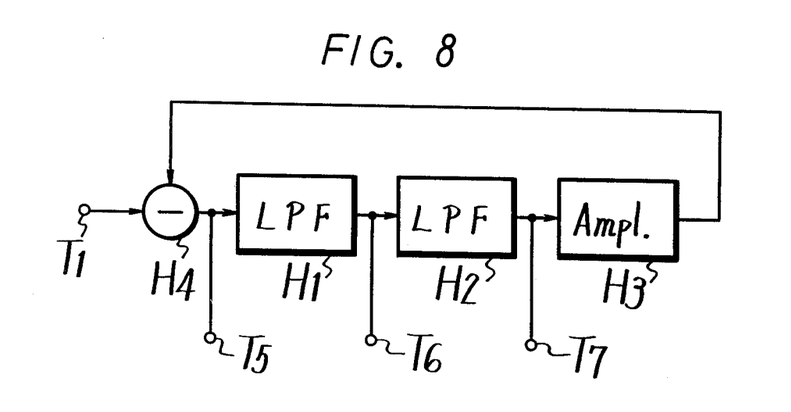

FIG. 8 represents a filter circuit which is constructed of two cascaded low-pass filter circuits $H_1$ and $H_2$ which may be of the construction described hereinabove with respect to the embodiments of FIGS. 1–7. In the filter circuit of FIG. 8, the output terminal of filter $H_1$ is connected to the input terminal of filter $H_2$, and also to an output terminal $T_6$. The output terminal of filter $H_2$ is connected to an amplifier $H_3$ and also to an output terminal $T_7$. Amplifier $H_3$ feeds back a filtered signal to a subtracting circuit $H_4$, the latter also being connected to input terminal $T_1$ to receive an input signal to be filtered. The output of subtracting circuit $H_4$, which is equal to the difference between the input signal and the fed back amplified signal, is supplied to filter $H_1$ and also to an output terminal $T_5$.

Let it be assumed that the cut-off frequency of low-pass filter $H_1$ is higher than the cut-off frequency of low-pass filter $H_2$. If subtracting circuit $H_4$ is omitted, for the moment, then the higher frequencies of the input signal supplied to input terminal $T_1$ are filtered out by low-pass filter $H_1$. Thus, a lower frequency signal is passed by filter $H_1$ to low-pass filter $H_2$. Since the cut-off frequency of filter $H_2$ is assumed to be lower than that of filter $H_1$, only the lower frequencies of the filtered signal supplied to filter $H_2$ (that is, the frequencies below the cut-off frequency of filter $H_2$) are passed therethrough. Thus, amplifier $H_3$ is supplied with a lower frequency signal, the original higher frequencies of which having been filtered out.

Now, when subtracting circuit $H_4$ is considered, it is appreciated that the lower frequency signal which is provided at the output of amplifier $H_3$ is subtracted from the original input signal supplied to input terminal $T_1$. Thus, subtracting circuit $H_4$ effectively subtracts, or cancels, the lower frequency signals from the original input signal. Consequently, output terminal $T_5$ is provided with a high frequency signal which, of course, is the difference signal between the input signal and the lower frequency signal that is subtracted from the input signal.

Low-pass filter $H_1$ removes the upper frequencies from the signal provided at the output of subtracting circuit $H_4$. Thus, output terminal $T_6$ is provided with a higher frequency signal (from subtracting circuit $H_4$) whose upper frequencies are removed (by filter $H_1$), thereby resulting in a band-pass filtered signal.

Thus, the filter circuit illustrated in FIG. 8 functions both as a high-pass filter to supply a high-pass filtered signal at output terminal $T_5$; and also as a band-pass filter to supply a band-pass filtered signal at output terminal $T_6$.

Figure 9:
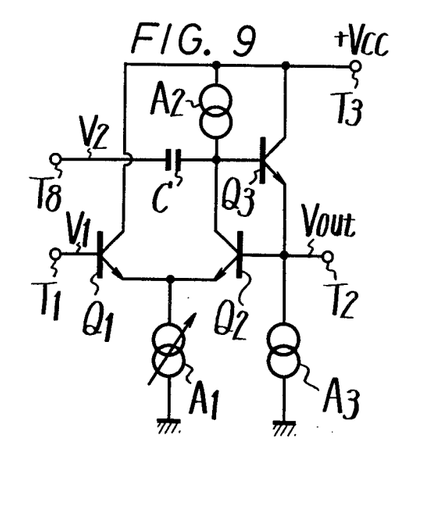

Referring now to FIG. 9, there is illustrated a modification of the embodiment described above with respect to FIG. 1. In this modified embodiment, the base electrode of transistor $Q_3$ is connected to an input terminal $T_8$ via capacitor C for receiving an input signal $V_2$. This differs from the previously described embodiment wherein the base electrode of transistor $Q_3$ is coupled via capacitor C to ground. If input terminal $T_1$ is supplied with the input signal $V_1$, then the signal path traversed by signal current $i_s$ is formed of input terminal $T_1$, the emitter resistances $r_e$ of transistors $Q_1$ and $Q_2$ and capacitor C to input terminal $T_8$. The signal circuit $i_s$ through capacitor C is equal to the signal current $i_s$ through the emitter resistances of transistors $Q_1$ and $Q_2$ and may be expressed as:

$$i_s = \frac{V_1 - V_{out}}{2r_e} = \frac{V_{out} - V_2}{\frac{1}{j\omega C}}. \quad (14)$$

The terms in equation (14) can be rearranged so as to solve for the output voltage $V_{out}$ as follows:

$$V_{out} = \frac{\frac{1}{j\omega C}}{\frac{1}{j\omega C} + 2r_e} \cdot V_1 + \frac{2r_e}{\frac{1}{j\omega C} + 2r_e} \cdot V_2, \quad (15)$$

$$= \frac{1}{1 + j\omega \cdot \frac{CR}{I}} \cdot V_1 + \frac{j\omega \cdot \frac{CR}{I}}{1 + j\omega \cdot \frac{CR}{I}} \cdot V_2, \quad (16)$$

wherein $R = 2kT/q$.

The first term in equation (16) represents that the filter circuit shown in FIG. 9 exhibits low-pass characteristics in response to the input voltage $V_1$ supplied to input terminal $T_1$. The second term in equation (16) represents that the filter circuit exhibits high-pass characteristics in response to the input voltage $V_2$ supplied to input terminal $T_8$. The cut-off frequency for the low-pass characteristic is equal to the cut-off frequency for the high-pass characteristic. These cut-off frequencies are controlled as a function of the current 2I through current source $A_1$.

If it is assumed that $V_1 = -V_2$, then the transfer function $H(\omega)$ for the filter circuit shown in FIG. 9 may be expressed as:

$$H(\omega) = \frac{1 - j\omega \cdot \frac{CR}{I}}{1 + j\omega \cdot \frac{CR}{I}}. \quad (17)$$

The transfer function of equation (17) is seen to have a variable phase that is a function of the current I. Thus, the embodiment of FIG. 9 functions as a controllable phase shift circuit when $V_1 = -V_2$, the amount of phase shift being controlled by the current 2I through current source $A_1$.

It is appreciated that each of the filter circuits shown in the foregoing embodiments may be constructed as an integrated circuit. As is typical, an IC must be provided with external connecting terminals, or pads, by which it can be electrically connected to other circuitry. These connecting terminals have been shown, in the illustrated embodiments, as terminals $T_1$, $T_2$ . . . . The cost of construction of an IC is determined, to a large part, by the number of such external connecting terminals that must be provided. In the foregoing embodiments, the filter circuit is shown with a minimum number of connecting terminals. Hence, the present invention is readily adapted for low cost IC manufacturing.

While the present invention has been particularly shown and described with reference to various embodiments, it should be readily appreciated to those of ordinary skill in the art that various changes and modifications in form and detail may be made without departing from the spirit and scope of the invention. For example, although the reactance device used herein has been shown as a capacitor, it may, alternatively, be replaced by an inductor. If an inductive reactance device is used, the filter circuit exhibits high-pass characteristics.

Also, it is appreciated that, in the various embodiments described above, current source $A_2$ may be replaced by current mirror transistors $Q_5$ and $Q_6$, and vice versa. Furthermore, current source $A_3$ may be any conventional current source, such as a current source transistor, a relatively high resistance, or the like. Preferably, current source $A_1$ is formed as a current source transistor whose collector-emitter current is controlled by a suitable control signal so as to correspondingly control the cut-off frequency of the filter circuit.

It is intended that the foregoing, as well as various other changes and modifications, be included within the scope of the appended claims.

What is claimed is:

1. A filter circuit, comprising an input terminal for receiving an input signal; first and second transistor means, each having base, emitter and collector electrodes, said first and second transistor means being connected in differential amplifier configuration and having their emitter electrodes connected to a common connection; variable current source means connected to said common connection; said input terminal being connected to the base electrode of said first transistor means; a source of reference potential; reactance means coupled between the collector electrode of said second transistor means and said source of reference potential; third transistor means having base, emitter and collector electrodes, the base electrode of said third transistor means being connected to the collector electrode of said second transistor means and the emitter electrode of said third transistor means being connected to the base electrode of said second transistor means; an additional current source connected to the emitter electrode of said third transistor means; resistance means connected between the emitter electrode of each of said first and second transistor means and said common connection; and an output terminal connected to the emitter electrode of said third transistor means, whereby the cut-off frequency of said filter circuit is a function of the current produced by said variable current source.

2. The circuit of claim 1 wherein said reactance means comprises a capacitor.

3. The circuit of claim 1, further comprising another current source connected to the collector electrode of said second transistor means.

4. The circuit of claim 3 wherein said other current source comprises one of a pair of transistors connected as a current mirror circuit, the other of said pair of transistors being connected in series with the collector electrode of said first transistor means.

5. The circuit of claim 1 further comprising a current mirror circuit including a pair of transistors whose collector-emitter circuits are connected to said first and second transistor means, respectively.

6. The circuit of claim 1 wherein said variable current source comprises an additional transistor; and means for supplying a current-control signal to the base electrode of said additional transistor to control the current flowing therein.

7. The circuit of claim 1 wherein said resistance means comprises ohmic resistors.

8. The circuit of claim 1 wherein said resistance means comprises n diodes connected to the emitter electrode of each said first and second transistor means, wherein n is an integer.

* * * * *